(12) United States Patent
Oka et al.

(10) Patent No.: US 10,388,346 B2
(45) Date of Patent: Aug. 20, 2019

(54) MEMORY CELL AND ARRAY HAVING DEVICE, P-TYPE TRANSISTOR AND N-TYPE TRANSISTOR

(71) Applicant: SONY CORPORATION, Tokyo (JP)

(72) Inventors: Mikio Oka, Kanagawa (JP); Yasuo Kanda, Kanagawa (JP); Yutaka Higo, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/553,051

(22) PCT Filed: Jan. 14, 2016

(86) PCT No.: PCT/JP2016/051016
§ 371 (c)(1),
(2) Date: Aug. 23, 2017

(87) PCT Pub. No.: WO2016/143383
PCT Pub. Date: Sep. 15, 2016

(65) Prior Publication Data
US 2018/0033476 A1 Feb. 1, 2018

(30) Foreign Application Priority Data
Mar. 9, 2015 (JP) .................................. 2015-046081

(51) Int. Cl.
*G11C 11/16* (2006.01)
*G11C 13/00* (2006.01)
*H01L 43/08* (2006.01)

(52) U.S. Cl.
CPC ...... *G11C 11/1675* (2013.01); *G11C 11/1653* (2013.01); *G11C 11/1659* (2013.01);
(Continued)

(58) Field of Classification Search
CPC ............ G11C 11/1675; G11C 11/1697; G11C 11/161; G11C 11/1657; G11C 13/0023;
(Continued)

(56) References Cited

U.S. PATENT DOCUMENTS

| 5,894,447 A * | 4/1999 | Takashima | .............. G11C 11/15 |
| | | | 257/E27.005 |
| 7,272,035 B1 * | 9/2007 | Chen | ....................... G11C 11/16 |
| | | | 365/158 |

(Continued)

FOREIGN PATENT DOCUMENTS

| JP | 2006-155719 A | 6/2006 |
| JP | 2011-155222 A | 8/2011 |

(Continued)

OTHER PUBLICATIONS

International Search Report and Written Opinion of PCT Application No. PCT/JP2016/051016, dated Feb. 16, 2016, 02 pages of English Translation and 06 pages of ISRWO.

*Primary Examiner* — Sung Il Cho
(74) *Attorney, Agent, or Firm* — Chip Law Group

(57) ABSTRACT

An object of the present technology is to improve the performance of a memory cell that stores the value reflecting the direction of an electric current. The memory cell includes an N-type transistor, a P-type transistor, and a storage element. The N-type transistor supplies a current either from a source to a drain thereof or from the drain to the source. The P-type transistor supplies a current from a source to a drain thereof. The storage element stores a logical value reflecting the direction of the current supplied from the drain of the N-type transistor and from the drain of the P-type transistor.

12 Claims, 17 Drawing Sheets

(52) U.S. Cl.
CPC ........ *G11C 11/1697* (2013.01); *G11C 13/003* (2013.01); *G11C 13/0023* (2013.01); *G11C 13/0026* (2013.01); *G11C 13/0069* (2013.01); G11C 11/161 (2013.01); G11C 11/1655 (2013.01); G11C 11/1657 (2013.01); G11C 2013/0073 (2013.01); G11C 2013/0076 (2013.01); G11C 2213/15 (2013.01); G11C 2213/74 (2013.01); G11C 2213/79 (2013.01); H01L 43/08 (2013.01)

(58) Field of Classification Search
CPC ............. G11C 13/0026; G11C 13/003; G11C 13/0069; G11C 2013/0073; G11C 2013/0076; G11C 2013/15; G11C 2013/74; G11C 2013/79; H01L 43/08
USPC .......................................................... 365/158
See application file for complete search history.

(56) References Cited

U.S. PATENT DOCUMENTS

| | | | | |
|---|---|---|---|---|
| 8,964,458 B2* | 2/2015 | Lin | ..................... | G11C 11/1659 365/148 |
| 9,911,481 B1* | 3/2018 | Alam | ................... | G11C 11/1655 |
| 2005/0195627 A1* | 9/2005 | Hutchens | ............ | H01L 29/6678 365/7 |
| 2006/0091991 A1* | 5/2006 | Wohlgenannt | ......... | G01R 33/09 338/13 |
| 2006/0098480 A1* | 5/2006 | Bessho | ............... | G11C 11/1659 365/158 |
| 2008/0308887 A1* | 12/2008 | Asao | ..................... | B82Y 10/00 257/421 |
| 2009/0230435 A1* | 9/2009 | Maejima | ................ | H01L 27/101 257/208 |
| 2010/0265759 A1* | 10/2010 | Chung | ................ | G11C 11/1659 365/158 |
| 2012/0182785 A1* | 7/2012 | Otsuka | .................. | B65D 71/125 365/148 |
| 2012/0230090 A1* | 9/2012 | Takahashi | ............... | G11C 11/16 365/158 |
| 2012/0257449 A1* | 10/2012 | Agan | ...................... | G11C 11/16 365/171 |
| 2013/0028010 A1* | 1/2013 | Li | ........................ | G11C 11/1659 365/158 |
| 2013/0301335 A1* | 11/2013 | Ong | ........................ | G11C 29/06 365/148 |
| 2013/0313623 A1* | 11/2013 | Vrudhula | ................. | H01L 43/02 257/295 |
| 2014/0112055 A1* | 4/2014 | Kawahara | .............. | G11C 13/00 365/148 |
| 2014/0112066 A1* | 4/2014 | Chow | ..................... | G11C 11/16 365/158 |
| 2014/0124881 A1* | 5/2014 | Kwon | ..................... | H01L 43/08 257/421 |
| 2015/0035032 A1* | 2/2015 | Kang | .................... | H01L 27/228 257/295 |
| 2015/0206565 A1* | 7/2015 | Aoki | .................... | G11C 11/1673 365/158 |
| 2017/0092355 A1* | 3/2017 | Kurotsuchi | ......... | G11C 11/1659 |

FOREIGN PATENT DOCUMENTS

| | | |
|---|---|---|
| JP | 2011-222829 A | 11/2011 |
| JP | 2013-030241 A | 2/2013 |
| JP | 2013-30241 A | 2/2013 |

* cited by examiner

F I G . 1
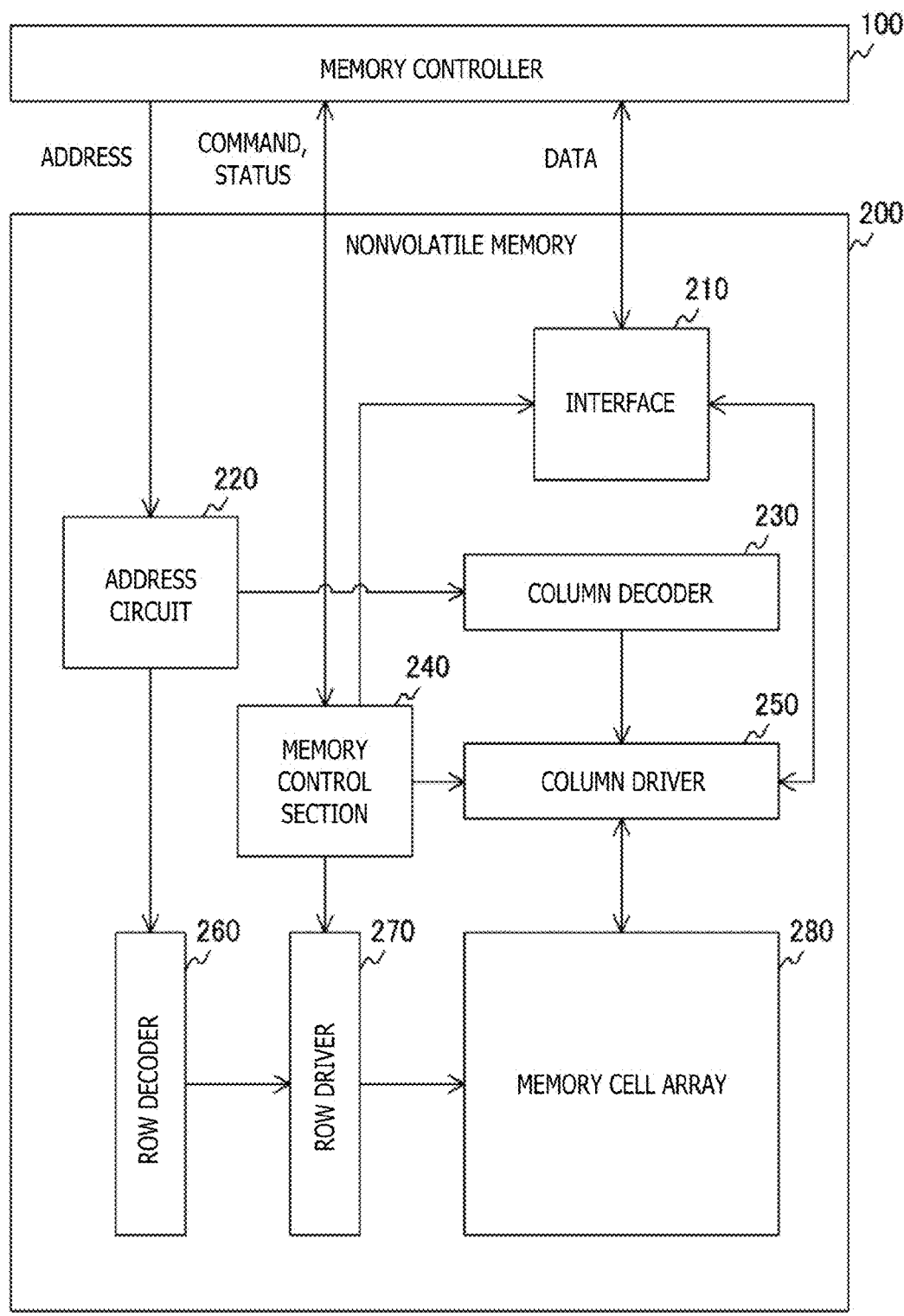

FIG.4

| MAGNETIZED STATE | ANTIPARALLEL STATE | PARALLEL STATE |
|---|---|---|
| LOGICAL VALUE | 「1」 | 「0」 |
| RESISTANCE VALUE | HIGH | LOW |
| DIRECTION OF CURRENT | SOURCE TO DRAIN | DRAIN TO SOURCE |

FIG.15

| | DRAIN-TO-SOURCE CURRENT $I_0$ (>THRESHOLD CURRENT $I_{th0}$) | SOURCE-TO-DRAIN CURRENT $I_1$ (>THRESHOLD CURRENT $I_{th1}$ > $I_{th0}$) |
|---|---|---|
| GATE WIDTH $W_p$ OF PMOS (>$W_n$) | UNRELATED | THE WIDER THE WIDTH, THE LARGER $I_1$ |
| GATE WIDTH $W_n$ OF NMOS | THE WIDER THE WIDTH, THE LARGER $I_0$ | LOW-VOLTAGE SIDE: THE WIDER THE WIDTH, THE LARGER $I_1$<br>HIGH-VOLTAGE SIDE: NOT MUCH RELATED |

MEMORY CELL AND ARRAY HAVING DEVICE, P-TYPE TRANSISTOR AND N-TYPE TRANSISTOR

CROSS REFERENCE TO RELATED APPLICATIONS

This application is a U.S. National Phase of International Patent Application No. PCT/JP2016/051016 filed on Jan. 14, 2016, which claims priority benefit of Japanese Patent Application No. JP 2015-046081 filed in the Japan Patent Office on Mar. 9, 2015. Each of the above-referenced applications is hereby incorporated herein by reference in its entirety.

TECHNICAL FIELD

The present technology relates to a memory cell and a storage device. More particularly, the technology relates to a memory cell and a storage device for storing the value reflecting the direction of an electric current.

BACKGROUND ART

Information processing systems in recent years have come to use extensively a nonvolatile memory as an auxiliary storage device or computer storage. Typical nonvolatile memories include a flash memory, a resistance random access memory (ReRAM), a phase-change random access memory (PCRAM), and a magneto-resistive random access memory (MRAM). One typical proposed MRAM is a storage device in which a storage element and an N-type metal-oxide-semiconductor (MOS) transistor connected therewith are provided in each memory cell (e.g., see PTLs 1 and 2). In this storage device, the retention value of a storage element is rewritten when its MOS transistor changes the direction of the current supplied to the storage element. Feeding a source-to-drain current $I_1$ from source to drain of an MOS transistor rewrites the logical value of the storage element to "1," for example. Feeding a drain-to-source current $I_0$ from drain to source of the MOS transistor rewrites the logical value of the storage element to "0," for example.

When the source terminal side of the above-described storage element is connected to a bit line, for example, and impressed with a voltage necessary for rewriting data to "1," the potential of the source terminal approaches the voltage applied to the storage element. In this state, the potential of the source terminal rises, so that the source-to-drain current $I_1$ drops (i.e., drive capability is reduced). This phenomenon is called substrate bias effect. If the source-to-drain current $I_1$ is smaller than a predetermined threshold current, an attempt to rewrite the storage element will fail. This requires making the source-to-drain current $I_1$ equal to or larger than the threshold current by widening the gate width of the MOS transistor or by reducing its gate length, for example. On the other hand, feeding the drain-to-source current $I_0$ does not bring about the substrate bias effect. In many cases, the drain-to-source current $I_0$ is thus sufficiently large. Compared with the source-to-drain current $I_1$, there is little need to enlarge the drain-to-source current $I_0$.

CITATION LIST

Patent Literatures

[PTL 1]
JP 2011-222829 A
[PTL 2]
JP 2011-155222 A

SUMMARY

Technical Problem

One problem with the above-mentioned type of nonvolatile memory is that if the gate width is widened or the gate length is reduced in order to make the source-to-drain current $I_1$ equal to or larger than the threshold value, the drain-to-source current $I_0$, which need not be enlarged, gets larger. If the drain-to-source current $I_0$ becomes larger than is necessary, the storage element can dielectrically break down or power consumption can increase. It is thus difficult for the above-mentioned type of nonvolatile memory to improve memory cell performance such as power efficiency or dielectric breakdown resistance.

The present technology has been devised in view of the above circumstances. An object of the technology is therefore to improve the performance of a memory cell that stores the value reflecting the direction of an electric current.

Solution to Problem

In solving the above problem and according to a first aspect of the present technology, there is provided a memory cell including an N-type transistor configured to supply a current either from a source to a drain thereof or from the drain to the source, a P-type transistor configured to supply a current from a source to a drain thereof, and a storage element configured to store a logical value reflecting the direction of the current supplied from the drain of the N-type transistor and from the drain of the P-type transistor. This structure provides the effect of storing in the storage element the logical value reflecting the direction of the current supplied from the drain of the N-type transistor and from the drain of the P-type transistor.

Also according to the first aspect, at least either a gate width or a gate length of the N-type transistor may be different from the corresponding gate width or the corresponding gate length of the P-type transistor. This structure provides the effect of storing in the storage element the logical value reflecting the direction of the current supplied from the drain of the N-type transistor and from the drain of the P-type transistor, at least either the gate width or the gate length of the N-type transistor being different from the corresponding gate width or the corresponding gate length of the P-type transistor.

Also according to the first aspect, the gate width of the N-type transistor may be narrower than the gate width of the P-type transistor. This structure provides the effect of storing in the storage element the logical value reflecting the direction of the current supplied from the drain of the N-type transistor and from the drain of the P-type transistor, the gate width of the N-type transistor being relatively narrow.

Also according to the first aspect, the gate length of the N-type transistor may be longer than the gate length of the P-type transistor. This structure provides the effect of storing in the storage element the logical value reflecting the direction of the current supplied from the drain of the N-type transistor and from the drain of the P-type transistor, the gate width of the N-type transistor being relatively long.

Also according to the first aspect, the storage element may be a magnetic tunnel junction element. This structure provides the effect of storing the logical value in the magnetic tunnel junction element.

Also according to the first aspect, the storage element may be a colossal magneto-resistance element. This structure provides the effect of storing the logical value in the colossal magneto-resistance element.

According to a second aspect of the present technology, there is provided a storage device including a plurality of memory cells and a driver. The memory cells each include an N-type transistor configured to supply a current either from a source to a drain thereof or from the drain to the source, a P-type transistor configured to supply a current from a source to a drain thereof, and a storage element configured to store a logical value reflecting the direction of the current supplied from the drain of the N-type transistor and from the drain of the P-type transistor. The driver controls a potential of the source and a potential of the drain. This structure provides the effect of storing in the storage element the logical value reflecting the direction of the current supplied from the drain of the N-type transistor and from the drain of the P-type transistor.

Also according to the second aspect, the N-type transistor and the P-type transistor may be arranged alternately in each of two directions perpendicular to one another. This structure provides the effect of storing in the storage element the logical value reflecting the direction of the current supplied from the drain of the N-type transistor and from the drain of the P-type transistor, the two types of transistors being arranged alternately.

Also according to the second aspect, a gate of the N-type transistor may be connected with a first word line, a gate of the P-type transistor may be connected with a second word line adjacent to the first word line, the storage element may be connected with the connection lines and with a first bit line, and the source of the N-type transistor and the source of the P-type transistor may be connected with a second bit line adjacent to the first bit line. This structure provides the effect of storing in the storage element the logical value reflecting the direction of the current supplied from the drain of the N-type transistor and from the drain of the P-type transistor, the two types of transistors being connected with the bit lines and the word lines.

Also according to the second aspect, when given an instruction to rewrite the logical value, the driver may cause the potential applied to either the source or the drain to become higher than the potential applied to the other. This structure provides the effect of causing the potential applied to either the source or the drain to become higher than the potential applied to the other.

Advantageous Effect of Invention

The present technology can provide an advantageous effect of improving the performance of a memory cell that stores the value reflecting the direction of an electric current. The advantageous effects mentioned in this description are only examples and not limitative of the present disclosure. Further advantages will be apparent from a reading of the disclosure.

BRIEF DESCRIPTION OF DRAWINGS

FIG. 1 is a block diagram depicting a typical configuration of a memory system as one embodiment.

FIG. 4 is a tabular view explanatory of the states of a memory cell in the embodiment.

FIG. 15 is a tabular view explanatory of relations between gate widths and currents in a variation of the embodiment.

DESCRIPTION OF EMBODIMENTS

Figure 2:
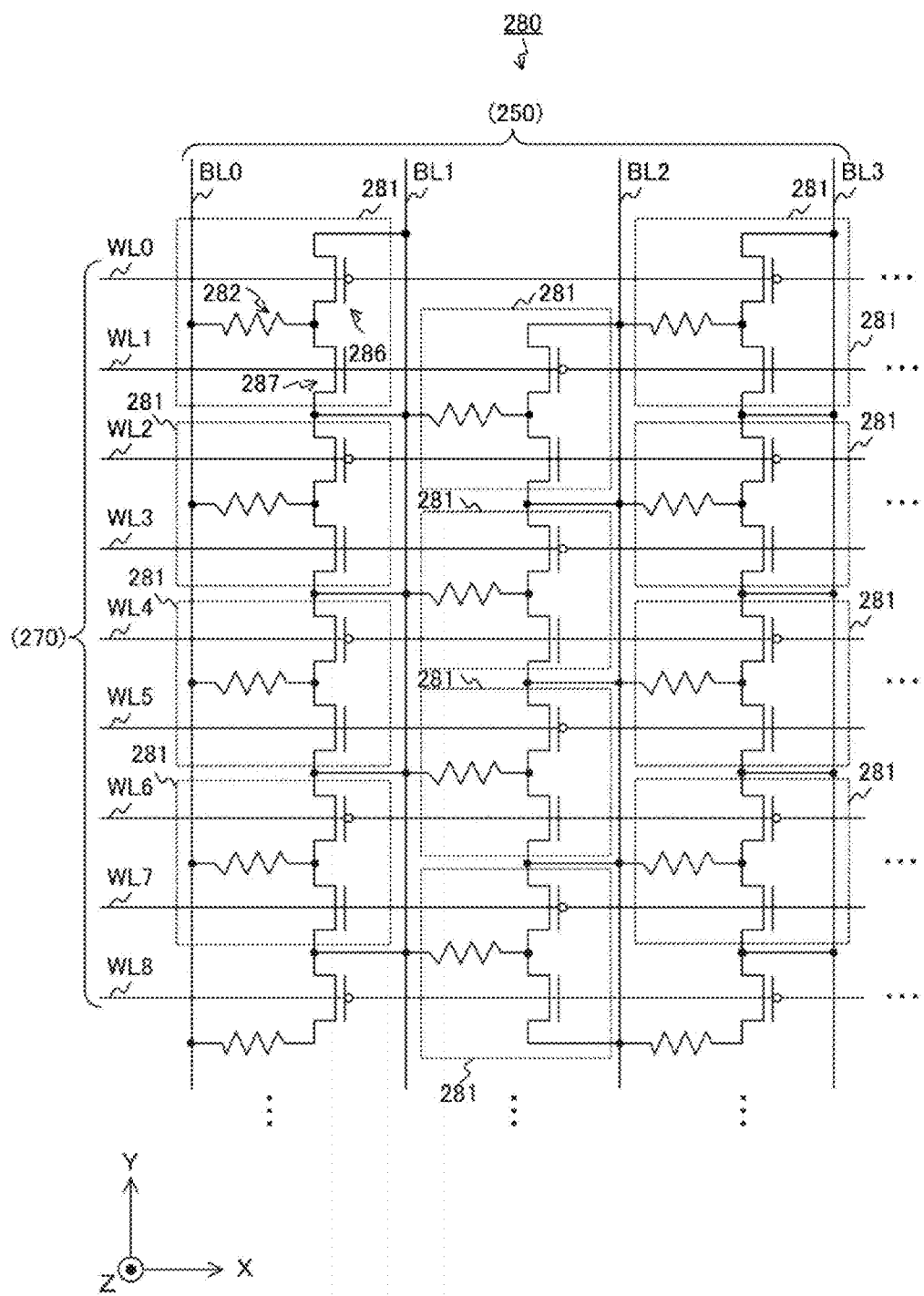
FIG. 2 is a circuit diagram depicting a typical structure of a memory cell array in the embodiment.

A mode for carrying out the present technology (called the embodiment hereunder) is described below. The description will be given under the following headings:
1. Embodiment (an example in which an N-type transistor and a P-type transistor are connected with a storage element)
2. Variation
<1. Embodiment>
Typical Configuration of Memory System FIG. 1 is a block diagram depicting a typical configuration of a memory system as one embodiment. The memory system includes a memory controller 100 and a nonvolatile memory 200. The nonvolatile memory 200 includes an interface 210, an address circuit 220, a column decoder 230, a memory control section 240, a column driver 250, a row decoder 260, a row driver 270, and a memory cell array 280. Incidentally, the nonvolatile memory 200 is an example of the storage device stated in the appended claims.

The memory controller 100 controls the nonvolatile memory 200. When a host computer (not depicted) issues an instruction to write data, the memory controller 100 generates a write address of the write destination and a write command. The memory controller 100 encodes the generated data using an error-correcting code (ECC) to generate write data. The memory controller 100 supplies the write address to the address circuit 220, the write command to the memory control section 240, and the write data to the interface 210. The memory controller 100 receives from the memory control section 240 status indicative of how the command has been executed, for example.

When the host computer issues an instruction to read data, the memory controller 100 generates a read address of the read destination and a read command. The memory controller 100 supplies the read address to the address circuit 220 and the read command to the memory control section 240. The memory controller 100 receives the read data from the interface 210 and decodes the received data. The memory controller 100 further receives status from the memory control section 240.

The interface 210 sends and receives data to and from the memory controller 100 under control of the memory control section 240. When read data is retrieved from the column driver 250, the interface 210 holds the read data. When the memory control section 240 issues an instruction to output the read data, the interface 210 outputs the read data to the memory controller 100, before deleting the read data. When write data is supplied from the memory controller 100, the interface 210 holds the write data. Under control of the memory control section 240, the interface 210 supplies the write data having been held to the column driver 250, before deleting the write data.

The address circuit 220 separates the address received from the memory controller 100 into a row address and a column address. The row address designates the row of the access destination in the memory cell array 280. The column address designates the column of the access destination in the memory cell array 280. The address circuit 220 supplies the row address to the row decoder 260 and the column address to the column decoder 230.

The column decoder 230 analyzes the column address received from the address circuit 220 to select the bit line corresponding to the column address. The bit lines are signal lines arrayed in the column direction in the memory cell array 280.

In accordance with the command issued from the memory controller 100, the memory control section 240 controls the interface 210, column driver 250, and row driver 270. If the issued command is a read command, the memory control section 240 supplies the column driver 250 and row driver 270 with a control signal instructing the read data to be retrieved.

If the issued command is a write command, the memory control section 240 instructs the column driver 250 and row driver 270 to be reset before being set.

A reset is a process of rewriting, in a memory cell in which a bit of "0" is written, the bit to "1". To reset is also called "program." A set is a process of rewriting, in a memory cell in which a bit of "1" is written, the bit to "0". To set is also called "delete." The memory control section 240 issues the instruction to reset and the instruction to set, in that order. Alternatively, the memory control section 240 may issue the instruction to set and the instruction to reset, in that order.

The memory control section 240 further generates status and supplies the generated status to the memory controller 100.

The column driver 250 applies voltages to the bit lines under control of the memory control section 240. When the memory control section 240 issues an instruction to read, the column driver 250 applies a high-level voltage to the bit line selected by the column decoder 230 while feeding a low-level voltage to the unselected bit lines. The column driver 250 retrieves read data from the accessed memory cell and supplies the read data to the interface 210.

When the memory control section 240 issues an instruction to reset, the column driver 250 reads data from the accessed memory cell as pre-read data. The column driver 250 reads write data from the interface 210 and compares the write data with the pre-read data bit by bit. The column driver 250 regards a memory cell corresponding to a bit of "1" in the write data and a bit of "0" in the pre-read data as a memory cell to be reset. The column driver 250 applies a high-level voltage to the bit line connected with the memory cell to be reset, thereby resetting the memory cell.

When the memory control section 240 issues an instruction to set, the column driver 250 compares the write data with the pre-read data bit by bit. The column driver 250 regards a memory cell corresponding to a bit of "0" in the write data and a bit of "1" in the pre-read data as a memory cell to be set. The column driver 250 applies a high-level voltage to the bit line connected with the memory cell to be set, thereby setting the memory cell. Incidentally, the column driver 250 is an example of the driver stated in the appended claims.

The row decoder 260 analyzes the row address received from the address circuit 220 to select the word line corresponding to the row address. The word lines are signal lines arranged in the row direction in the memory cell array 280.

The row driver 270 applies voltages to the word lines under control of the memory control section 240. When the memory control section 240 issues an instruction to read, to set, or to reset, the row driver 270 applies a high-level voltage for a predetermined time period to the word line WL selected by the row decoder 260 while feeding a low-level voltage to the unselected word lines WL.

The memory cell array 280 has multiple memory cells arrayed in a matrix pattern. For example, the individual memory cells may be spin transfer torque magnetic random access memory (STT-MRAM) cells.

Typical Structure of Memory Cell Array

FIG. 2 is a circuit diagram depicting a typical structure of the memory cell array 280 in the embodiment. The memory cell array 280 is made up of multiple memory cells 281 arranged therein. Each memory cell 281 includes a storage element 282, a P-type transistor 286, and an N-type transistor 287. The P-type transistor 286 and the N-type transistor 287 may each be a metal-oxide-semiconductor field-effect transistor (MOSFET), for example.

The storage element 282 stores a logical value reflecting the direction of a supplied electric current. One end of the storage element 282 in an n-th column (n is an integer) is connected with a bit line in the n-th column; the other end of the storage element 282 is connected with the drain of the P-type transistor 286 and that of the N-type transistor 287.

The P-type transistor 286 and N-type transistor 287 are arranged alternately in the x direction, which is the row direction, and in the y direction, which is the column direction. If either a region of each P-type transistor 286 or a region of each N-type transistor 287 is painted black and a region of the other transistor is painted white, the memory cell array 280 will present a checkerboard pattern. For example, in the x direction, the N-type transistors 287 are disposed in odd-numbered columns and the P-type transistors 286 in even-numbered columns. In the y direction, the N-type transistors 287 are disposed in odd-numbered rows and the P-type transistors 286 in even-numbered rows.

The source of each P-type transistor 286 and the source of each N-type transistor 287 in the n-th column are connected with a bit line in the (n+1)th column.

For example, the memory cells 281 in the 0th column are disposed between a bit line BL0 and a bit line BL1. The storage elements 282 in these memory cells 281 are connected with the bit line BL0. The source of each P-type transistor 286 and the source of each N-type transistor 287 in the 0th column are connected with the bit line BL1.

Typical Structure of Memory Cell

Figure 3:
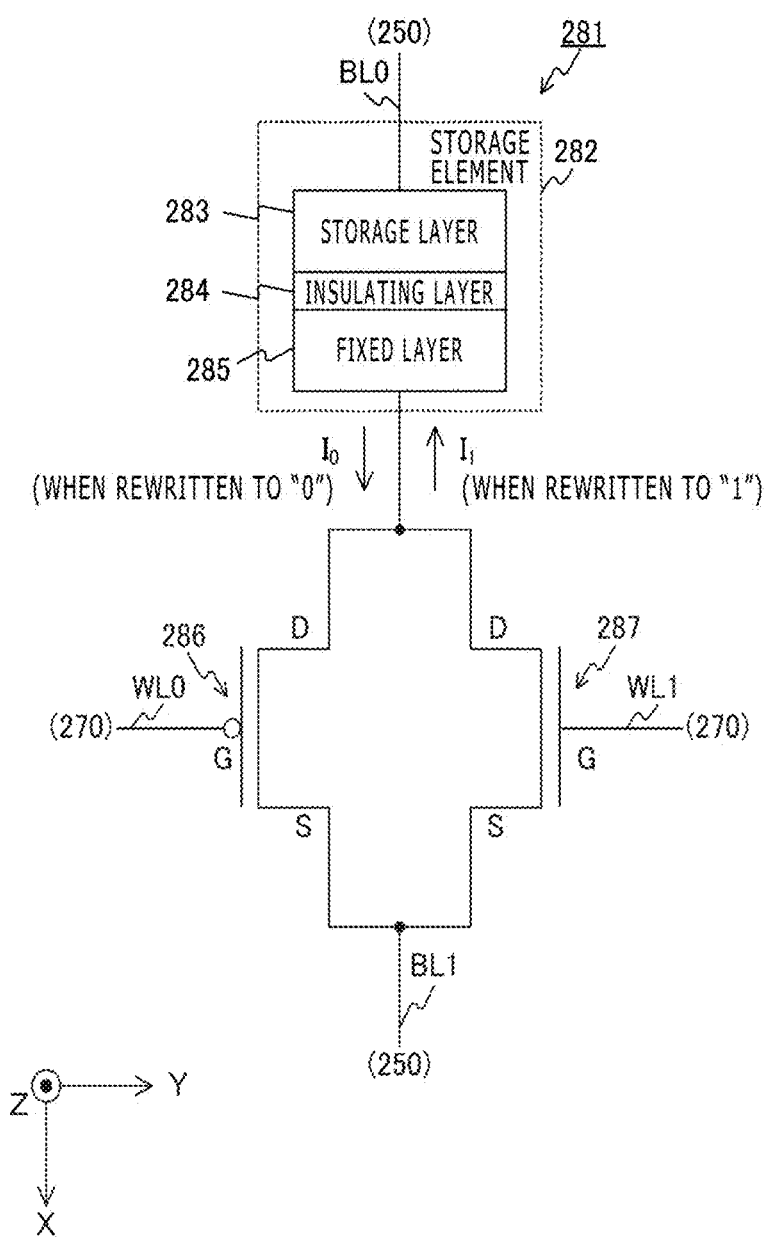
FIG. 3 is a circuit diagram depicting a typical structure of a memory cell in the embodiment.

FIG. 3 is a circuit diagram depicting a typical structure of the memory cell 281 in the embodiment. The gate (G), drain (D), and source (S) of the P-type transistor 286 are connected with a word line WL0, the storage element 282, and the bit line BL1, respectively. The gate (G), drain (D), and source (S) of the N-type transistor 287 are connected with a word line WL1, the storage element 282, and the bit line BL1, respectively.

The storage element 282 has a storage layer 283, an insulating layer 284, and a fixed layer 285. The storage layer 283 is connected with the bit line BL0. The fixed layer 285 is connected with a connection point between the drain of the P-type transistor 286 and that of the N-type transistor 287. It is assumed that the gate width of the P-type transistor 286 and that of the N-type transistor 287 are approximately the same and so are their gate lengths. The gate width is the size of the gate in a direction perpendicular to the source-to-drain direction, and the gate length is the size of the gate in the source-to-drain direction.

The storage layer 283 is a layer in which the direction of magnetization changes depending on the direction of a supplied electric current. The insulating layer 284 provides a tunnel junction between the storage layer 283 and the fixed layer 285. The fixed layer 285 is a layer in which the direction of magnetization is fixed. In accordance with the direction of magnetization in the storage layer 283, the resistance value of the storage element 282 changes. The value of the storage element 282 is read by, for example, a sense amplifier in the column driver 250 detecting the voltage reflecting the resistance value. Feeding a current larger than a threshold value to the storage element 282 rewrites the value retained in the storage element 282. The threshold value for a current needed to rewrite the retention value when the direction of magnetization between the storage layer 283 and the fixed layer 285 is changed from parallel state to antiparallel state is larger than when the direction of magnetization is inverse therebetween. The threshold value drops in proportion to the decreasing volume of the storage element 282, which makes scaling possible.

The storage element 282 in which the insulating layer 284 provides a tunnel junction between the storage layer 283 and the fixed layer 285 as described above is called a magnetic tunnel junction (MTJ) element.

When the retention value of the memory cell 281 is to be rewritten, the row driver 270 brings the word line (e.g., WL0) connected with the P-type transistor 286 to the low level and the word line (e.g., WL1) connected with the N-type transistor 287 to the high level. This causes the P-type transistor 286 and the N-type transistor 287 to transition simultaneously from off-state to on-state. When the bit is to be rewritten to "1," the column driver 250 brings the source-side bit line (e.g., BL1) to the high level and the drain-side bit line (e.g., BL0) to the low level. This causes the current to flow from source to drain, rewriting the storage element 282 to "1." When the bit is to be rewritten to "0," the column driver 250 brings the drain-side bit line (e.g., BL0) to the high level and the source-side bit line (e.g., BL1) to the low level. This causes the current to flow from drain to source, rewriting the storage element 282 to "0."

FIG. 4 is a tabular view explanatory of the states of the memory cell 281 in the embodiment. The magnetized states of the storage element 282 in the memory cell 281 are of two kinds: a parallel state in which the direction of magnetization in the storage element 282 is the same as the direction of magnetization in the fixed layer 285, and an antiparallel state in which these directions are different. Each of these states is assigned a different logical value. For example, the antiparallel state is assigned a logical value "1" and the parallel state is assigned a logical value "0."

The resistance value of the storage element 282 in the antiparallel state is higher than in the parallel state. Thus the logical value of the storage element 282 is read by, for example, a sense amplifier in the column driver 250 detecting the voltage of the memory cell 281 corresponding to the resistance value.

Changing the direction of the current flowing to the storage element 282 rewrites the logical value held by the storage element 282. For example, a bit of "1" is rewritten to "0" by causing the current $I_0$ to flow from drain to source of the P-type transistor 286 and the N-type transistor 287.

On the other hand, a bit of "0" is rewritten to "1" by causing the current $I_1$ to flow from source to drain of the P-type transistor 286 and the N-type transistor 287. In the description that follows, the current $I_0$ flowing from drain to source will be referred to as "drain-to-source current" and the current $I_1$ flowing in the opposite direction of the current $I_0$ as "source-to-drain current."

Generally, the current necessary for changing the parallel state ("0") to the antiparallel state ("1") is larger than the current for changing the antiparallel state ("1") to the parallel state ("0"). That is, a threshold current $I_{th1}$ necessary for rewriting to "1" is larger than a threshold current $I_{th0}$ for rewriting to "0."

Figure 5A:
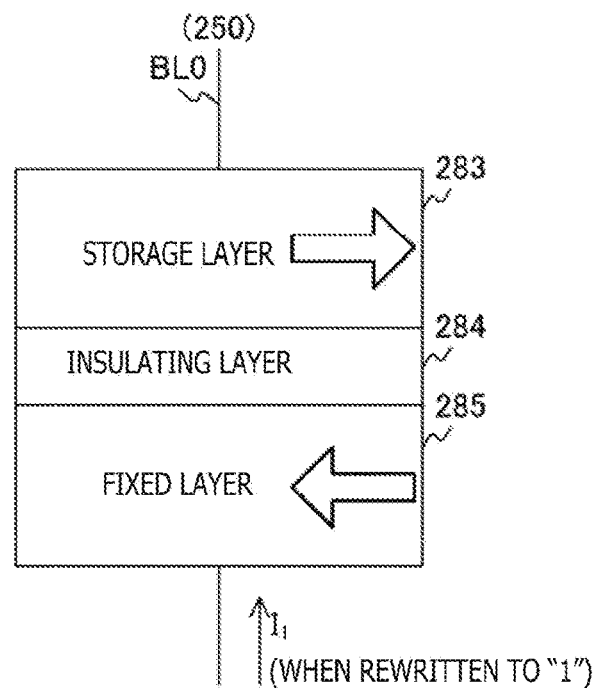
FIGS. 5a and 5b are schematic views depicting typical magnetized states of a memory cell in the embodiment.
Figure 5B:
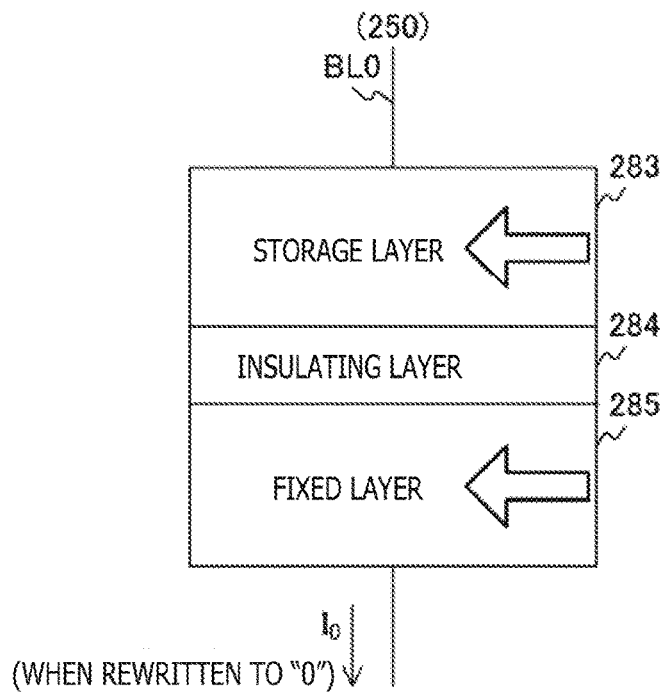

FIGS. 5a and 5b are schematic views depicting typical magnetized states of the memory cell 281 in the embodiment. In the drawing, a thick arrow indicates the direction of magnetization and a thin arrow denotes the direction of the current. FIG. 5a depicts a typical magnetized state of the memory cell 281 applicable when a bit of "0" is rewritten to "1." When the bit is to be rewritten to "1," the source-to-drain current $I_1$ is supplied from source to drain (i.e., from the fixed layer 285 to the storage layer 283). This reverses the direction of magnetization in the storage layer 283, making the direction opposite the direction of magnetization in the fixed layer 285, which brings about the antiparallel state.

FIG. 5b depicts a typical magnetized state of the memory cell 281 applicable when a bit of "1" is rewritten to "0." When the bit is to be rewritten to "0," the drain-to-source current $I_0$ is supplied from drain to source (i.e., from the storage layer 283 to the fixed layer 285). This again reverses the direction of magnetization in the storage layer 283, making the direction the same as the direction of magnetization in the fixed layer 285, which brings about the parallel state. Whereas FIGS. 5a and 5b depict a typical horizontal magnetic field type storage element in which the direction of magnetization is parallel to the plane of the storage layer, this is not (imitative of the storage element structure. Alternatively, the storage element may be of a vertical magnetic field type in which the direction of magnetization is vertical to the storage layer plane.

Whereas the memory cell 281 has an MTJ element as the storage element 282, an element other than the MTJ element may be used as the storage element 282 as long as it can store the value reflecting the direction of the electric current. For example, the MTJ element may be replaced with a colossal magneto-resistance (CMR) element. A memory cell 281 having the CMR element is called ReRAM.

Figure 6A:
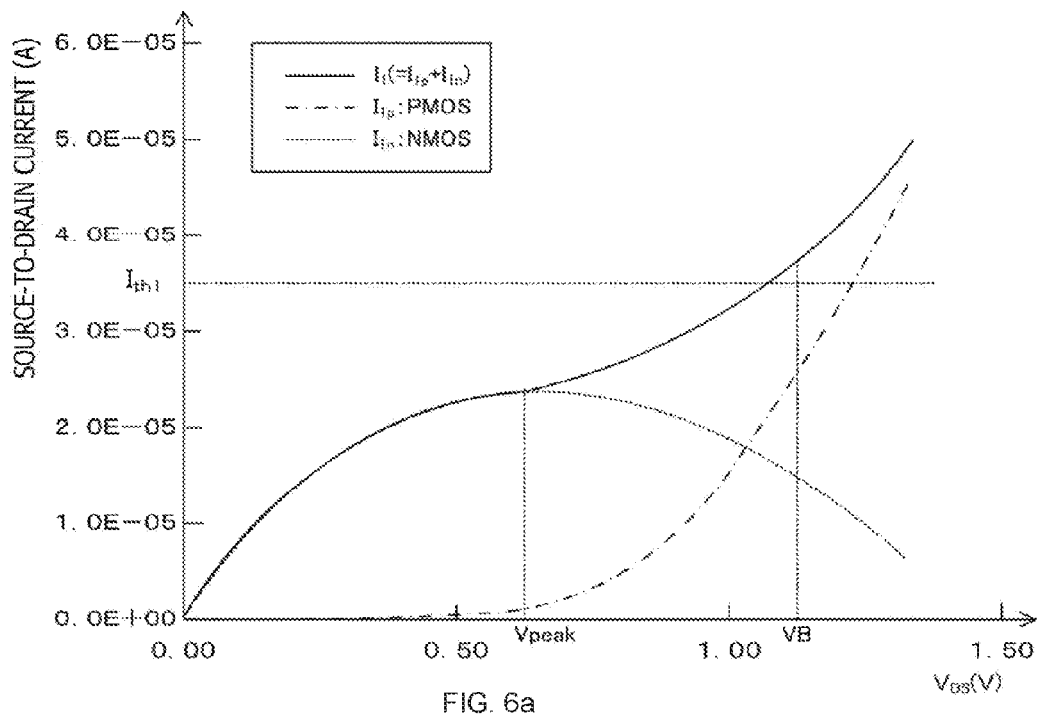
FIGS. 6a and 6b are graphic representations depicting typical current-voltage characteristics of a memory cell in the embodiment.
Figure 6B:
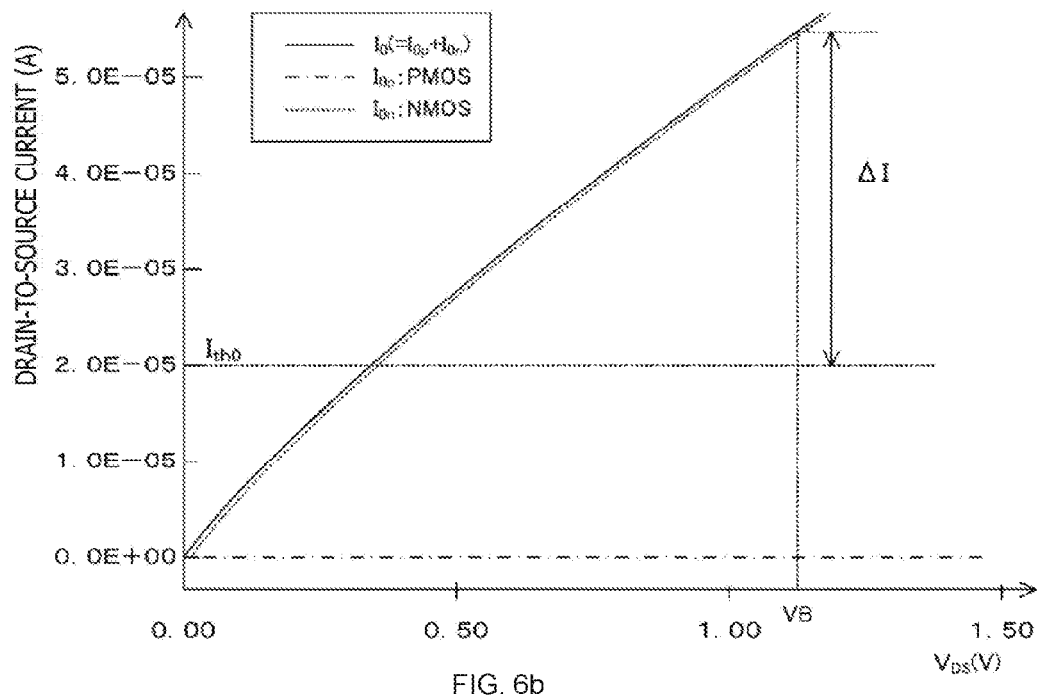

FIGS. 6a and 6b are graphic representations depicting typical current-voltage characteristics of the memory cell 281 in the embodiment. The graphs in the drawing are simulated under the following conditions:

Word line (WL0) on the side of the P-type transistor 286: −1.08 volts (V)
Word line (WL1) on the side of the N-type transistor 287: 1.08 V
Bit line (e.g., BL0) on either the drain side or the source side: 1.08 V
Bit line (e.g., BL1) on the other side: 0 V
Temperature: 25 degrees (° C.)

The vertical axis in FIGS. 6a and 6b represent the current supplied to the memory cell 281, and the horizontal axis denotes the voltage applied by the column driver 250. Dot-and-dash line curves indicate the characteristics of the P-type transistor 286, and dotted lines stand for the characteristics of the N-type transistor 287. Solid line curves represent the sum of the currents from the respective transistors.

FIG. 6a depicts an example of the current-voltage characteristics applicable when a bit is rewritten to "1." When the bit is to be rewritten to "1," the column driver 250 brings the source-side bit line (e.g., BL1) to the high level and the drain-side bit line (e.g., BL0) to the low level, before applying a voltage $V_{DS}$ between the drain and the source. Because the gate and the source of the N-type transistor 287 are both at the high level, a source-to-gate voltage $V_{GS}$ is lowered due to the substrate bias effect. The lowered voltage $V_{GS}$ falls short of a boundary voltage $V_{OV}$ between a linear region and a saturated region, with the N-type transistor 287 operating in the linear region. In the linear region, a current $I_{1n}$ flowing from source to drain of the N-type transistor 287 is defined by the following expression:

$$I_{1n} = uC_{OX}(W_n/L_n)\{(V_{GS}-V_{th})V_{DS}-\tfrac{1}{2}V_{DS}^2\} \qquad \text{Exp. 1}$$

In the above expression, u represents charge mobility in volts per square meter per second (m²/V·s), for example. $C_{OX}$ denotes the capacity of a gate insulating film in the N-type transistor 287 and is given in farads (F) for example. $L_n$ stands for the gate length of the N-type transistor 287 and $W_n$ for its gate width. $L_n$ and $W_n$ are each given in micrometers (μm), for example. $V_{GS}$ stands for a source-to-gate voltage, $V_{th}$ for a threshold voltage, and $V_{DS}$ for a drain-to-source voltage. These voltages are given in volts (V), for example.

According to the expression 1 above, if $\tfrac{1}{2} \times (V_{GS}-V_{th})$ is regarded as Vpeak, the current $I_{1n}$ flowing through the N-type transistor 287 increases the higher the voltage $V_{DS}$ in a low-voltage region where the voltage $V_{DS}$ falls short of Vpeak. However, the current $I_{1n}$ drops the higher the voltage $V_{DS}$ in a high-voltage region where the voltage $V_{DS}$ is higher than Vpeak.

Meanwhile, the gate of the P-type transistor 286 is at the low level and its source is at the high level. That means the source-to-gate voltage $V_{GS}$ is a negative voltage sufficient for driving the P-type transistor 286. The P-type transistor 286 operates in the linear region. A current $I_{1p}$ flowing from source to drain of the P-type transistor 286 driven in the linear region is defined by the following expression:

$$I_{1p} = u/2 \times (W_p/L_p)C_{OX}(V_{GS}-V_{th})^2 \times \{1+r(V_{DS}-V_{OV})\} \qquad \text{Exp. 2}$$

In the above expression, $L_p$ stands for the gate length of the P-type transistor 286, $W_p$ for its gate width, and r for a channel modulation coefficient. Whereas $V_{th}$, $C_{OX}$, and $V_{OV}$ may or may not be the same for both the P-type transistor 286 and the N-type transistor 287, the same reference signs are used for purpose of explanation.

According to the expression 2 above, the current $I_{1p}$ flowing through the P-type transistor 286 increases the higher the voltage $V_{DS}$. That means the source-to-drain current $I_1$ as the sum of the current $I_{1n}$ and current $I_{1p}$ is larger the higher the voltage $V_{DS}$. The lower the voltage $V_{DS}$, the larger the proportion of the current $I_{1n}$ becomes; the higher the voltage $V_{DS}$, the larger the proportion of the current $I_{1p}$.

As described above, to rewrite a bit to "1" requires controlling the source-to-drain current $I_1$ to be equal to or larger than the threshold current $I_{th1}$. The voltage $V_{DS}$ is thus brought to a value (e.g., voltage value VB) such as to produce a source-to-drain current $I_1$ equal to or larger than the threshold current $I_{th1}$.

FIG. 6b depicts an example of the current-voltage characteristics applicable when a bit is rewritten to "0." When the bit is to be rewritten to "0," the column driver 250 brings the potential of the drain-side bit line (e.g., BL0) to the high level and the potential of the source-side bit line (e.g., BL1) to the low level, before applying the voltage $V_{DS}$ between the drain and the source.

Because the gate of the N-type transistor 287 is at the high level and its source is at the low level, the source-to-gate voltage $V_{GS}$ becomes higher than $V_{OV}$, with the N-type transistor 287 operating in the saturated region. On the other hand, the gate and the source of the P-type transistor 286 are both at the low level, so that the voltage $V_{GS}$ falls short of the threshold value and that the P-type transistor 286 is in an off-state. Given the expression 2 above, a drain-to-source current $I_{0n}$ of the N-type transistor 287 in the linear region is expressed using $I_{0n}$ replacing $I_{1p}$, $W_n$ replacing $W_p$, and $L_n$ replacing $L_p$ in a newly formed expression. According to the new expression, the current $I_{0n}$ flowing through the N-type transistor 287 increases the higher the voltage $V_{DS}$. Thus the drain-to-source current $I_0$ as the sum of the currents of the respective transistors increases the higher the voltage $V_{DS}$.

As discussed above, the threshold current $I_{th1}$ is larger than the threshold current $I_{th0}$. It follows that bringing the voltage $V_{DS}$ to a value (e.g., voltage value VB) such as to produce a minimum source-to-drain current $I_1$ exceeding $I_{th1}$ provides a drain-to-source current $I_0$ sufficiently larger than the threshold current $I_{th0}$. The difference, denoted by ΔI, between the threshold current $I_{th0}$ and the drain-to-source current $I_0$ is preferably minimal from the viewpoint of reducing power consumption. The drain-to-source current $I_0$ and the source-to-drain current $I_1$ must each be smaller than a breakdown current Ib that causes dielectric breakdown of the storage element 282.

To sum up, the expressions 1 and 2 above are used to set the gate width and the date length of the P-type transistor 286 and the N-type transistor 287 in such a manner that $I_1$ and $I_2$ will meet the following conditions:

$$I_{th0} < I_0(=I_{0n}) < Ib$$

$$I_{th1} < I_1(=I_{1n}+I_{1p}) < Ib$$

Figure 7A:
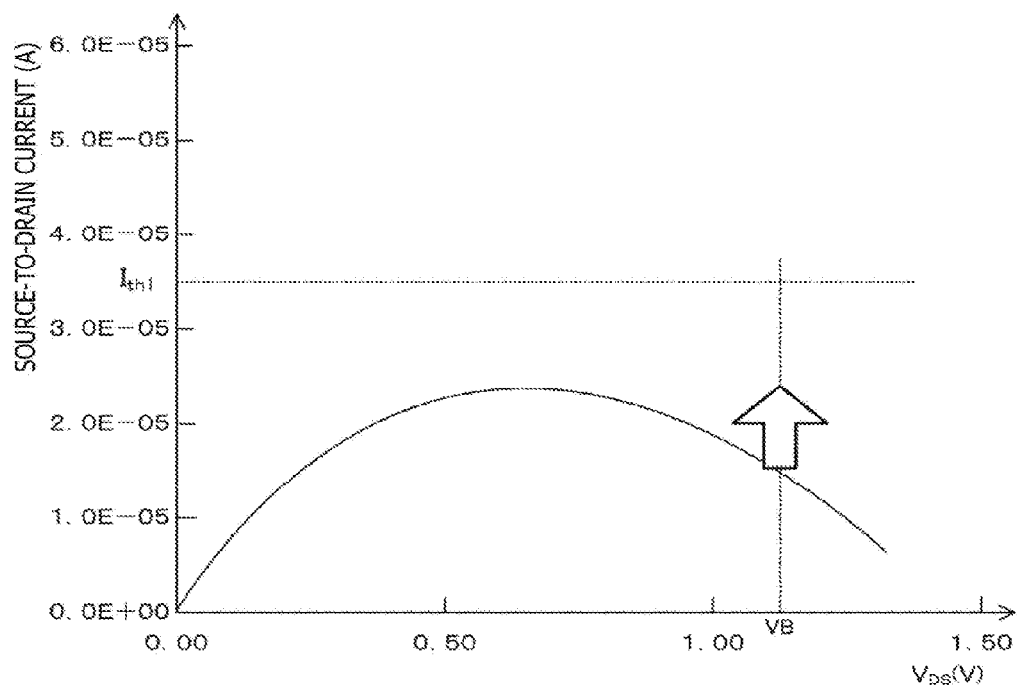
FIGS. 7a and 7b are graphic representations depicting typical current-voltage characteristics of a memory cell as a comparative example.
Figure 7B:
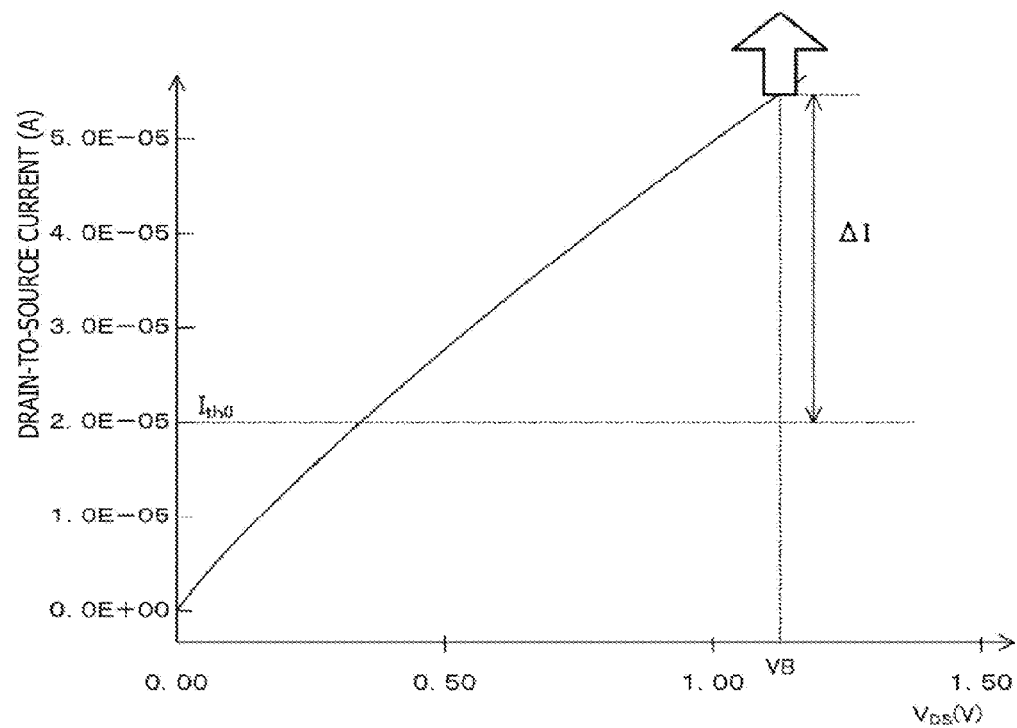

FIGS. 7a and 7b are graphic representations depicting typical current-voltage characteristics of a memory cell as a comparative example. In this comparative example, each memory cell has only an N-type transistor and a storage element. FIG. 7a depicts an example of the current-voltage characteristics applicable when a bit is rewritten to "1," and "b" in the drawing depicts an example of the current-voltage characteristics applicable when a bit is rewritten to "0." The vertical axis in FIGS. 7a and 7b denotes the current supplied to the memory cell 281 and the horizontal axis represents the voltage applied by the column driver 250.

As depicted in FIG. 7a, the source-to-drain current $I_1$ drops due to the substrate bias effect, so that the drive current alone from the N-type transistor falls short of the threshold voltage $I_{th1}$. In this case, it is necessary either to widen the gate width or to reduce the gate length in such a manner that the source-to-drain current $I_1$ will be equal to or larger than the threshold voltage $I_{th1}$. However, widening the gate width, for example, would raise the drain-to-source current $I_0$ as depicted in FIG. 7b. This would cause an excessive current to flow compared with the minimum required threshold current $I_{th0}$. That in turn would increase power consumption.

By contrast, the memory cell 281 is additionally provided with the P-type transistor 286. The current $I_{1n}$, which may be small due to the substrate bias effect, is supplemented with the current $I_{1p}$, so that the source-to-drain current $I_1$ becomes equal to or larger than the threshold voltage $I_{th1}$. Thus the gate width of the N-type transistor 287 can be narrower and its gate length shorter than the comparative example. A narrower gate width (or a longer gate length) reduces the drain-to-source current $I_0$, so that power consumption becomes lower than with the comparative example.

Figure 8:
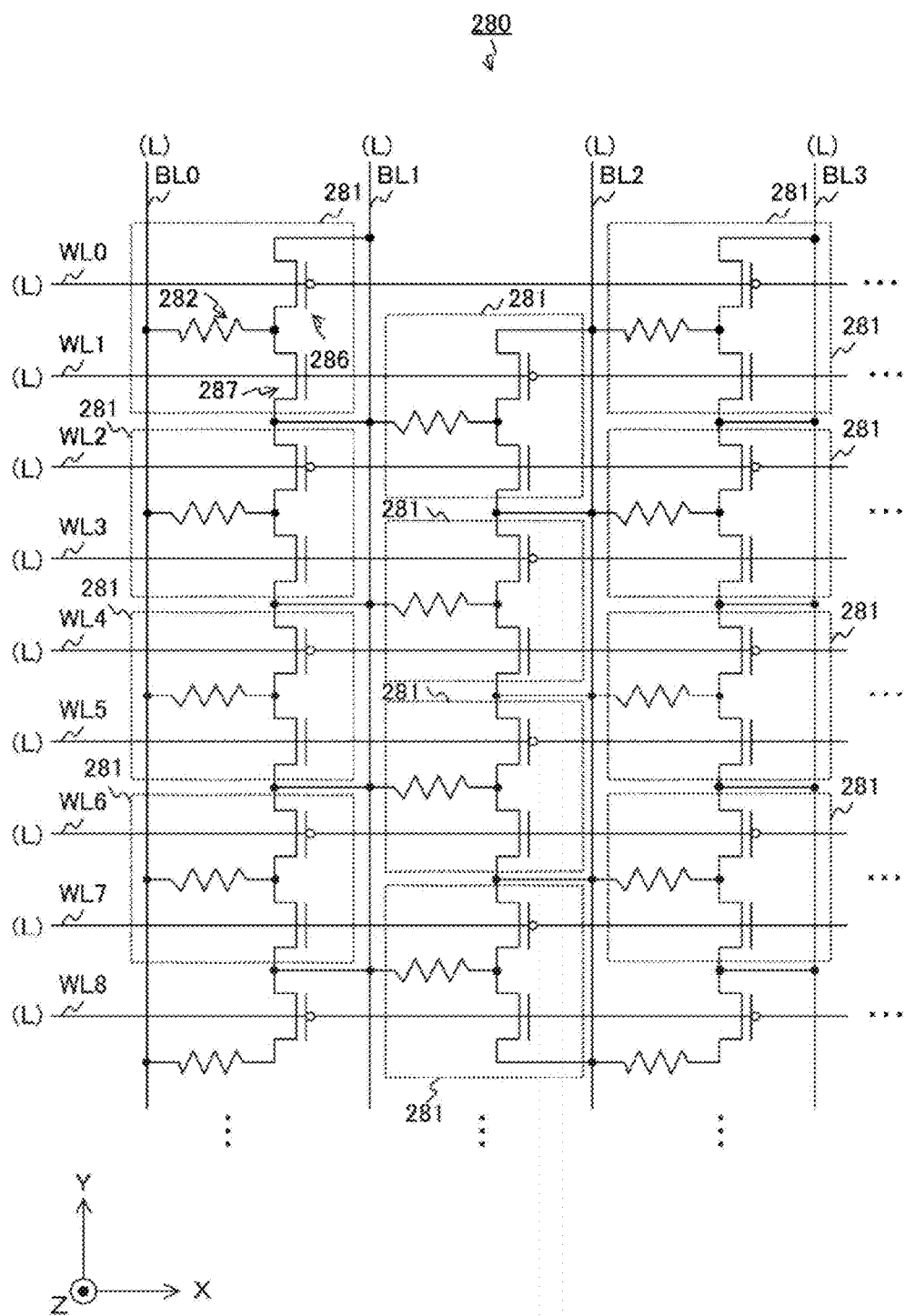
FIG. 8 is a schematic view depicting typical potentials of bit and word lines in a standby state in the embodiment.

FIG. 8 is a schematic view depicting typical potentials of bit and word lines in a standby state in the embodiment. The standby state is a state in which no memory cell is accessed. In this state, all potentials of the bit lines and word lines are brought to the low level.

Figure 9:
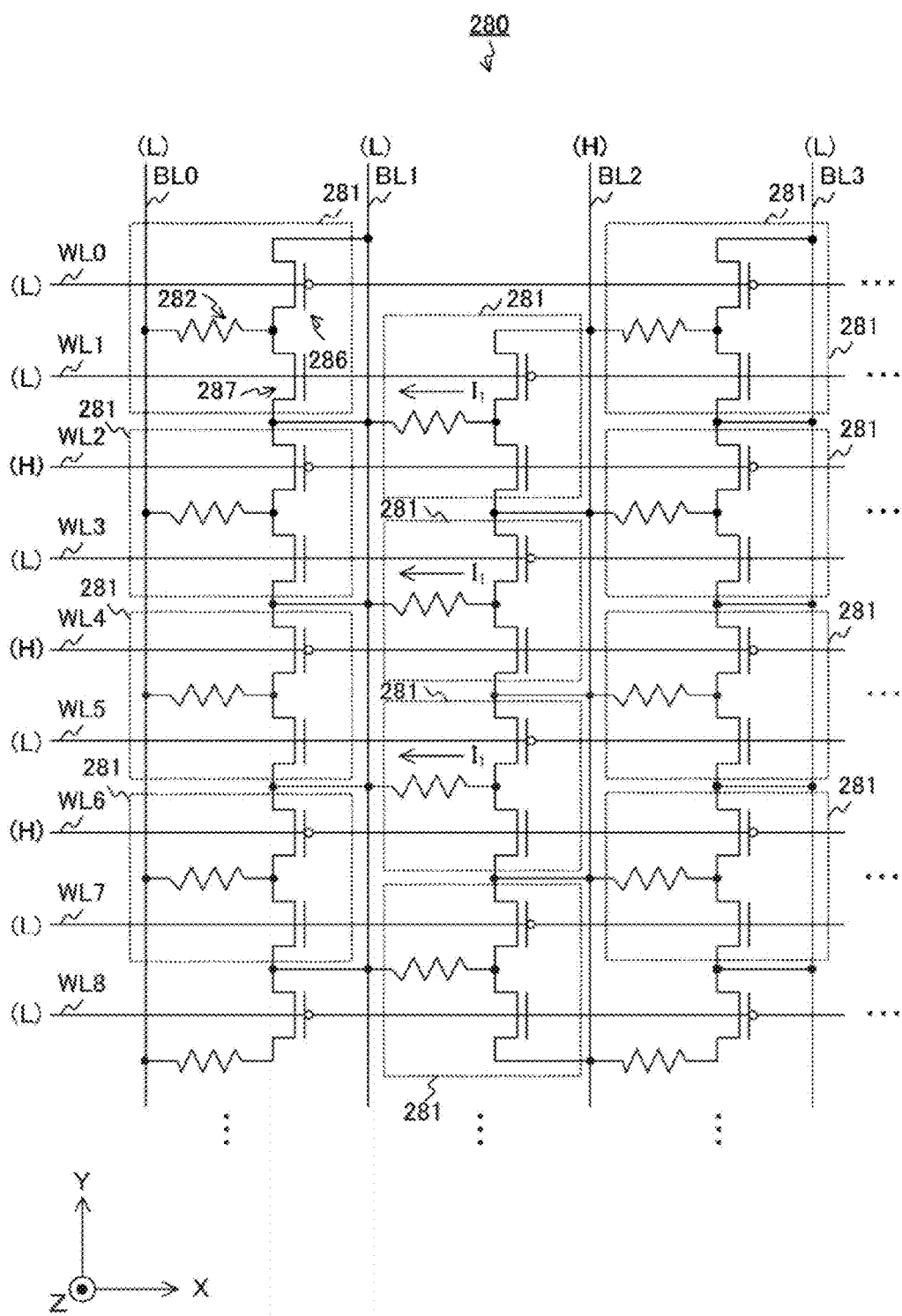
FIG. 9 is a schematic view depicting typical potentials of bit and word lines applicable when a bit is rewritten to "1" in the embodiment.

FIG. 9 is a schematic view depicting typical potentials of bit and word lines applicable when a bit is rewritten to "1" in the embodiment. When the bit is to be rewritten to "1," the column driver 250 brings to the high level the source-side bit line in the memory cell 281 targeted for rewrite and brings the other bit lines to the low level. For example, if a memory cell 281 in the first column is targeted for rewrite, a source-side bit line BL2 is brought to the high level and the other bit lines BL0, BL1, etc., are brought to the low level. The row driver 270 brings to the high level the word line connected with the N-type transistor 287 in the memory cell targeted for rewrite and brings the other word lines to the low level.

Suppose that the first column is targeted for rewrite and that the bit line BL2 has been brought to the high level. Although the bit line BL2 is also connected with the second column, which is not targeted for rewrite, the memory cell in the second column will not be rewritten. That is because the P-type transistor 286 and the N-type transistor 287 are alternately arranged in the X and the Y directions. In this arrangement, the word line (e.g., WL1) connected with the N-type transistor 287 in the first column is connected with the P-type transistor 286 in the second column. Given this connection, the row driver 270 turns on the N-type transistor 287 in the first column. This turns off the P-type transistor 286 in the second column. That in turn prevents a current from flowing through the storage element 282 in the second column not targeted for rewrite, so that the storage element 282 will not be rewritten. That is, when the P-type transistor 286 and the N-type transistor 287 are arranged alternately in the X and the Y directions, only the memory cell 281 targeted for rewrite is selectively rewritten.

Figure 10:
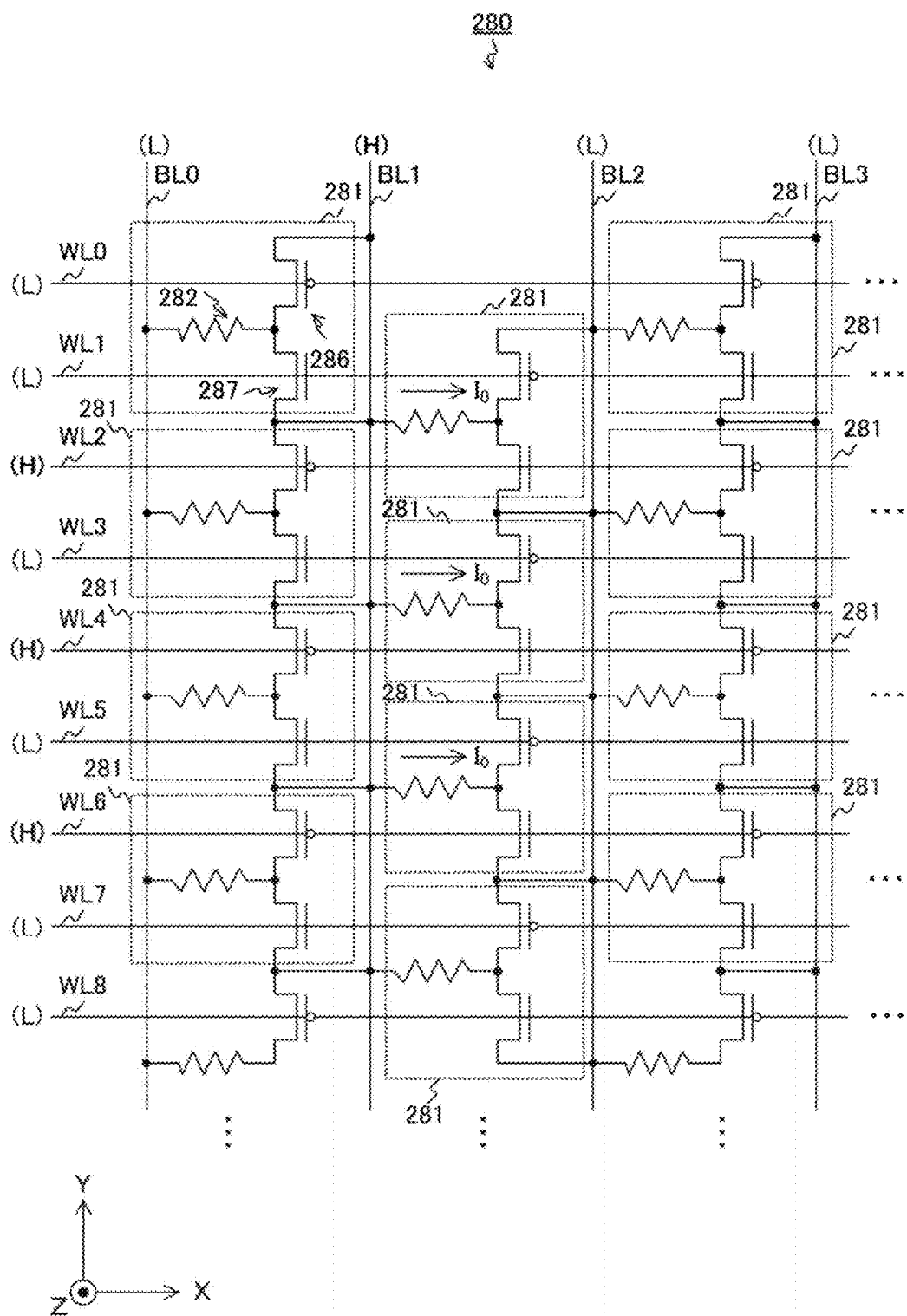
FIG. 10 is a schematic view depicting typical potentials of bit and word lines applicable when a bit is rewritten to "0" in the embodiment.

FIG. 10 is a schematic view depicting typical potentials of bit and word lines applicable when a bit is rewritten to "0" in the embodiment. When the bit is to be rewritten to "0," the column driver 250 brings to the high level the drain-side bit line in the memory cell 281 targeted for rewrite and brings the other bit lines to the low level. For example, when the memory cell 281 in the first column is to be rewritten, the drain-side bit line BL1 is brought to the high level and the other bit lines BL2, BL3, etc., are brought to the low level.

The row driver 270 brings to the high level the word line connected with the N-type transistor 287 in the memory cell targeted for rewrite and brings the other word lines to the low level.

Figure 11:
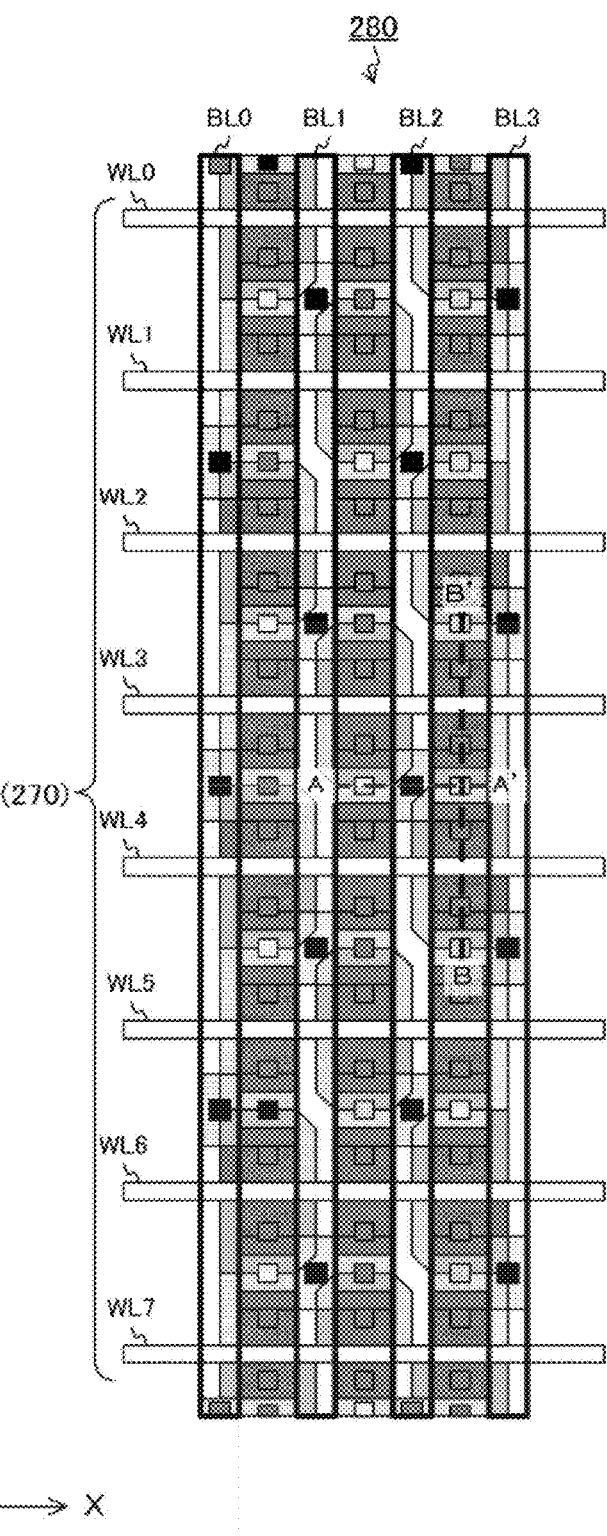
FIG. 11 is a typical plan view of the memory cell array in the embodiment.

FIG. 11 is a typical plan view of the memory cell array in the embodiment. As depicted in the drawing, bit lines are arranged in the Y direction and word lines are arrayed in the X direction. N-type and P-type transistors are disposed between the bit lines and the word lines.

Figure 12:
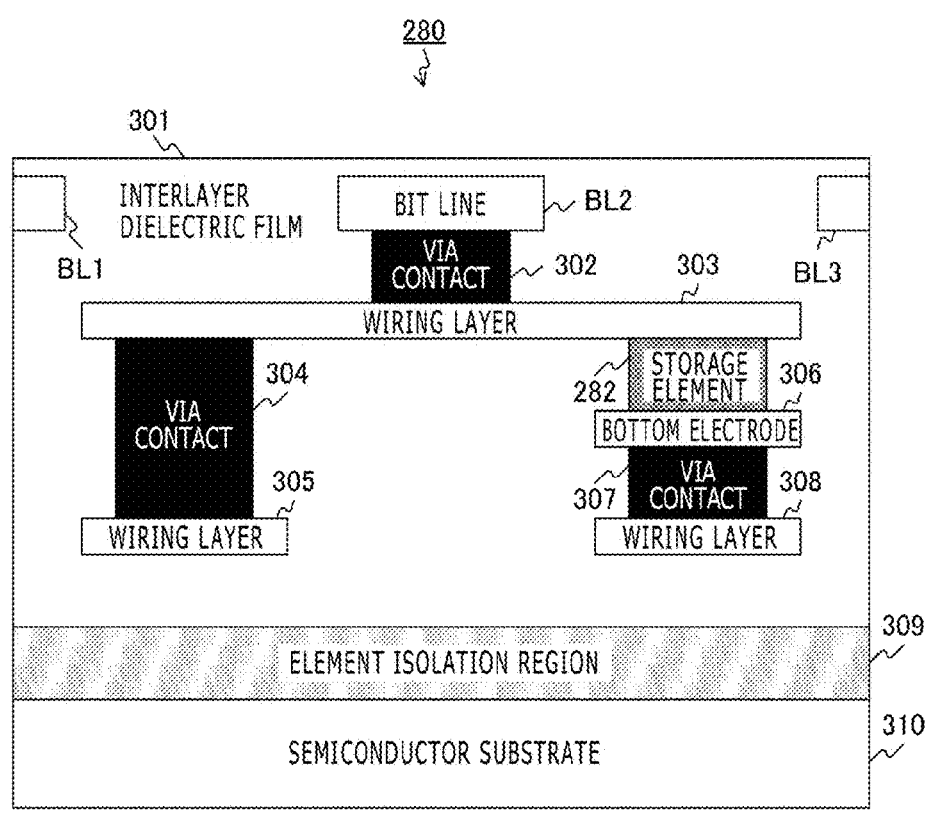
FIG. 12 is a typical cross-sectional view taken in parallel with an X-axis of the memory cell array in the embodiment.

FIG. 12 is a typical cross-sectional view taken along a line segment A-A in FIG. 11. For purpose of explanation, a given Z direction perpendicular to the X direction and to the Y direction will be referred to as "upward" direction and the reverse direction as "downward" direction. An element isolation region 309 is formed over a semiconductor substrate 310. Typically, an interlayer dielectric film 301 is formed over the element isolation region 309. Wiring layers 305 and 308 are formed in the lowermost layer of the interlayer dielectric film 301. The wiring layer 305 is connected through a via contact 304 with a wiring layer 303 above. The wiring layer 308 is connected through a via contact 307 with a bottom electrode 306. The storage element 282 is formed between the bottom electrode 306 and the wiring layer 303. The wiring layer 303 is connected through a via contact 302 with the bit line BL2. In this structure, one end of the storage element 282 is connected through the wiring layer 303 and the via contact 302 with the bit line BL2.

Figure 13:
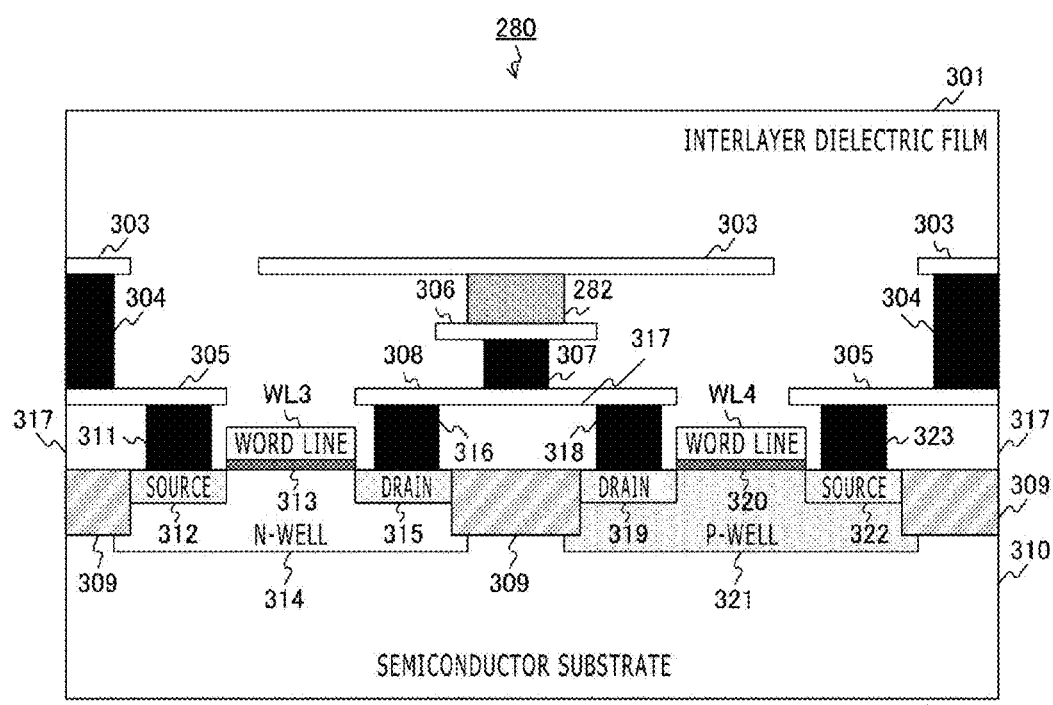
FIG. 13 is a typical cross-sectional view taken in parallel with a Y-axis of the memory cell array in the embodiment.

FIG. 13 is a typical cross-sectional view taken along a line segment B-B in FIG. 11. An N-well region 314 and a P-well region 321 are formed over the semiconductor substrate 310. These regions are isolated from one another by the element isolation region 309. The N-well region 314 and the P-well region 321 are arranged alternately in the Y direction. A source 312 and a drain 315 are formed in the N-well region 314. A gate insulating film 313 is formed between the source 312 and the drain 315. A word line WL3 is formed over the gate insulating film 313. The source 312 is connected through a via contact 311 with the wiring layer 305. The drain 315 is connected through a via contact 316 with the wiring layer 308. The word line WL3 over the gate insulating film 313 is used as a gate. The gate, source 312, drain 315, and N-well region 314 function as the N-type transistor 287.

In the P-well region 321, a drain 319 and a source 322 are formed. A gate insulating film 320 is formed between the drain 319 and the source 322. A word line WL4 is formed over the gate insulating film 320. The source 322 is connected through a via contact 323 with the wiring layer 305. The drain 319 is connected through a via contact 318 with the wiring layer 308. A diffusion layer region 317 is formed between the via contacts 316 and 318. The word line WL4 over the gate insulating film 320 is used as a gate. The gate, source 322, drain 319, and P-well region 321 function as the P-type transistor 286. The drain of the P-type transistor 286 and that of the N-type transistor 287 are connected with the storage element 282 through the via contacts 307, 316 and 318, the wiring layer 308, and the bottom electrode 306.

Typical Operations of Nonvolatile Memory

Figure 14:
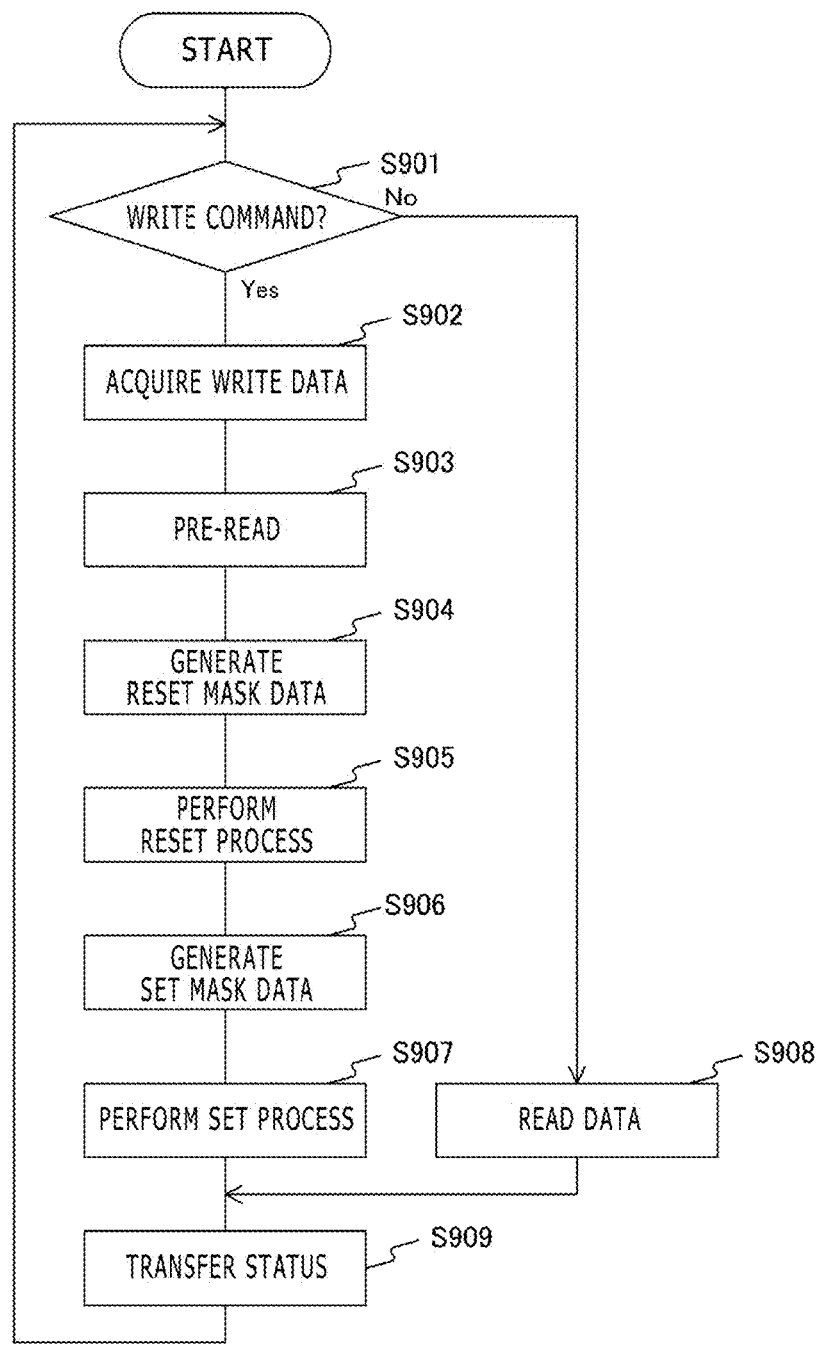
FIG. 14 is a flowchart depicting typical operations of a nonvolatile memory in the embodiment.

FIG. 14 is a flowchart depicting typical operations of the nonvolatile memory 200 in the embodiment. The operations are started typically when the memory system is turned on. The nonvolatile memory 200 first determines whether or not the command from the memory controller 100 is a write command (step S901). It is assumed here that the command from the memory controller 100 is either a write command or a read command.

If the write command is given ("Yes" in step S901), the nonvolatile memory 200 acquires write data (step S902) and performs a pre-read (step S903). The nonvolatile memory 200 compares the write data with the pre-read data bit by bit. Based on the result of the comparison, the nonvolatile memory 200 generates reset mask data indicative of the memory cell targeted for rewrite (step S904). On the basis of the reset mask data, the nonvolatile memory 200 performs a reset process of rewriting the targeted memory cell to "1" (step S905).

Next, in accordance with the result of comparison between the write data and the pre-read data, the nonvolatile memory 200 generates set mask data indicative of the memory cell targeted for rewrite (step S906). On the basis of the set mask data, the nonvolatile memory 200 performs a set process of rewriting the targeted memory cell to "0" (step S907).

If the read command is given ("No" in step S901), the nonvolatile memory 200 reads data from the memory cell and feeds it to the memory controller 100 (step S908). Following step S907 or S908, the nonvolatile memory 200 generates status and transfers it to the memory controller 100 (step S909). Thereafter, the nonvolatile memory 200 repeats step S901 and subsequent steps.

In the embodiment of the present technology, as described above, the N-type transistor that supplies currents in two directions and the P-type transistor that supplies a current from the source to the drain are connected with the storage element. The structure helps increase the source-to-drain current $I_1$. This allows the current $I_1$ to be larger than the threshold current $I_{th1}$ with a relatively narrow gate width $W_n$. The relatively narrow gate width $W_n$ decreases the current $I_0$ flowing in the opposite direction of the current $I_1$. This contributes to reducing power consumption and eliminating the possibility of dielectric breakdown of the storage element 282. As a result, memory cell performance is improved.

<2. Variation>

In the first embodiment, the gate width of the P-type transistor 286 and that of the N-type transistor 287 are approximately the same, and so are the gate length of the P-type transistor 286 and that of the N-type transistor 287. Alternatively, at least either the gate width or the gate length may be different between the two types of transistors. According to the expressions 1 and 2 above, the drain-to-source current increases the wider the gate width or the shorter the gate length. It is preferred that the current supplied by the P-type transistor 286 be larger than the current fed by the N-type transistor 287. Thus it is preferred that the gate width of the P-type transistor 286 be narrower than that of the N-type transistor 287 and that the gate length of the P-type transistor 286 be longer than that of the N-type transistor 287. The memory cell 281 in this variation of the first embodiment is different from the first embodiment in that at least either the gate width or the gate length is different between the P-type transistor 286 and the N-type transistor 287.

FIG. 15 is a tabular view explanatory of relations between gate widths and currents in one variation of the embodiment. The gate width $W_p$ of the P-type transistor 286 is not related with the drain-to-source current $I_0$ for rewriting a bit to "0." Changing the gate width $W_p$ leaves the drain-to-source current $I_0$ substantially unchanged. Meanwhile, according to the expression 2 above, the drain-to-source current $I_0$ increases the wider the gate width $W_n$ of the N-type transistor 287.

Also according to the expression 2 above, the source-to-drain current $I_1$ for rewriting a bit to "1" increases the wider the gate width $W_p$ of the P-type transistor 286. On the low-voltage side where the voltage $V_{DS}$ is equal to or lower than Vpeak, the source-to-drain current $I_1$ increases the wider the gate width $W_n$ of the N-type transistor 287 according to the expression 1 above. On the high-voltage side where the voltage $V_{DS}$ is higher than Vpeak, the gate width $W_n$ of the N-type transistor 287 is not much related with the source-to-drain current $I_1$ according to the expression 1 above.

The threshold current $I_{th0}$ necessary for rewriting a bit to "0" is smaller than the threshold current $I_{th1}$ necessary for rewriting a bit to "1." That means the drain-to-source current $I_0$ may be smaller than the source-to-drain current $I_1$. To decrease the drain-to-source current $I_0$, the gate width $W_n$ of the N-type transistor 287 need only be narrowed. Although narrowing the gate width $W_n$ decreases the source-to-drain current $I_1$ along with the drain-to-source current $I_0$, the drop in the source-to-drain current $I_1$ is compensated by widening the gate width $W_p$. Thus it is preferred that the gate width $W_n$ be narrower than the gate width $W_p$. For the same reason, it is preferred that the gate length of the N-type transistor 287 be longer than that of the P-type transistor 286.

The gate length of the P-type transistor 286 and that of the N-type transistor 287 may be the same while the gate width of the P-type transistor 286 and that of the N-type transistor 287 may be different. Alternatively, the gate width of the P-type transistor 286 and that of the N-type transistor 287 may be the same while the gate length of the P-type transistor 286 and that of the N-type transistor 287 may be different. As another alternative, the gate width of the P-type transistor 286 and that of the N-type transistor 287 may be different, and the gate length of the P-type transistor 286 and that of the N-type transistor 287 may also be different.

Figure 16:
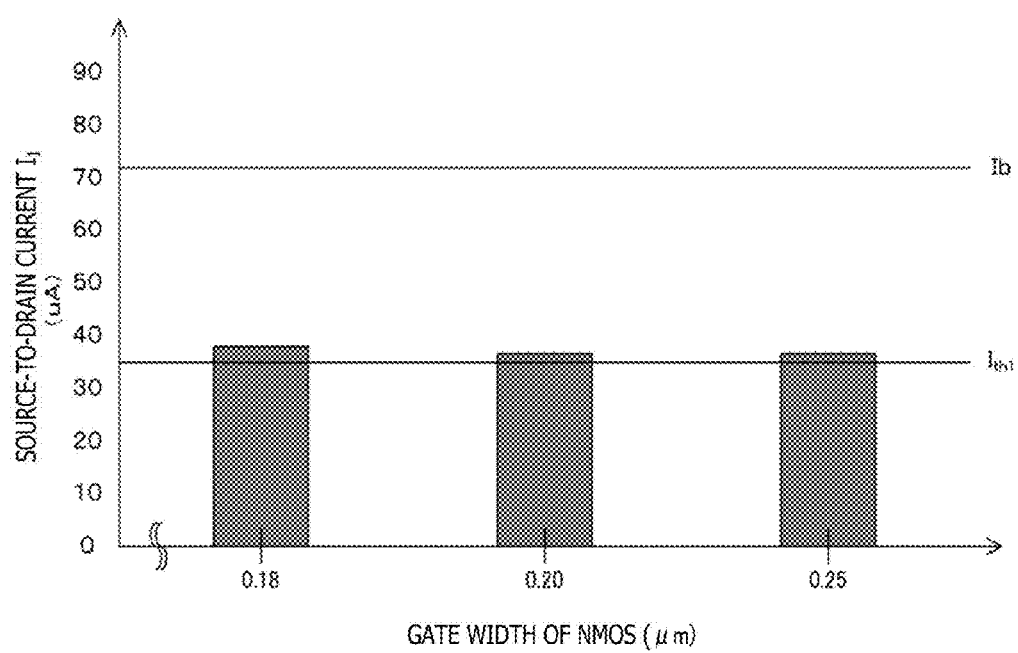
FIG. 16 is a graphic representation depicting source-to-drain currents applicable to different gate widths in the variation of the embodiment.

FIG. 16 is a graphic representation depicting source-to-drain currents applicable to different gate widths in the variation of the embodiment. The vertical axis in FIG. 16 denotes the source-to-drain current $I_1$ that appears when the voltage $V_{DS}$ sufficiently higher than Vpeak is applied, and the horizontal axis represents the gate width $W_n$ of the N-type transistor 287. It is assumed here that the gate width $W_p$ of the P-type transistor 286 is constant (e.g., 0.25 micrometers). As depicted in FIG. 16, varying the gate width $W_n$ of the N-type transistor 287 leaves the source-to-drain current $I_1$ substantially constant; there is not much relation between these parameters. That is because the substrate bias effect decreases the current $I_{1n}$ from the N-type transistor 287, so that the current $I_{1p}$ from the P-type transistor 286 becomes dominant as the source-to-drain current $I_1$.

Figure 17:
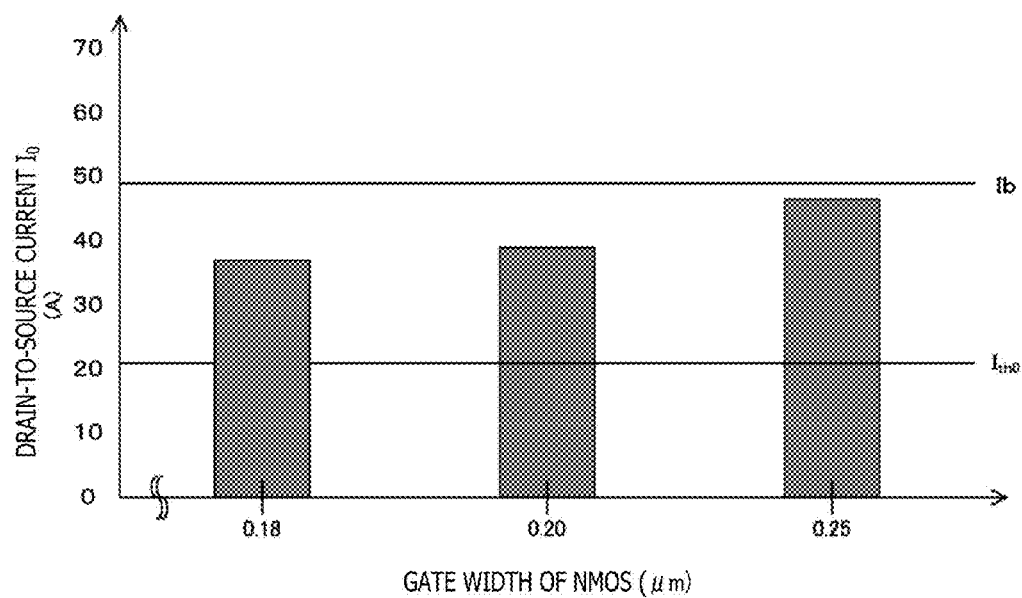
FIG. 17 is a graphic representation depicting drain-to-source currents applicable to different gate widths in the variation of the embodiment.

FIG. 17 is a graphic representation depicting drain-to-source currents applicable to different gate widths in the variation of the embodiment. The vertical axis in FIG. 17 represents the drain-to-source current $I_0$ that appears when a predetermined voltage $V_{DS}$ is applied, and the horizontal axis denotes the gate width $W_n$ of the N-type transistor 287. Ib stands for a breakdown current that causes dielectric breakdown of the storage element 282. As depicted in FIG. 17, the drain-to-source current $I_0$ decreases the narrower the gate width $W_n$. The smaller the drain-to-source current $I_0$, the lower the power consumption becomes. The decreased drain-to-source current $I_0$ increases the difference with the breakdown current Ib, thus reducing the possibility of dielectric breakdown of the storage element 282. This allows the gate width $W_n$ to be narrower, thereby improving the performance of the memory cell 281 such as its power efficiency or its dielectric breakdown resistance.

In the variation of the first embodiment, as described above, the gate width of the N-type transistor 287 is made narrower than that of the P-type transistor 286. The structure allows the drain-to-source current $I_0$ to be smaller than if the gate widths of the two types of transistors are approximately the same. This contributes to improving the power efficiency and dielectric breakdown resistance of the memory cell.

The embodiments described above are merely examples in which the present technology may be implemented. The particulars of the embodiments correspond basically to the inventive matters claimed in the appended claims. Likewise, the inventive matters named in the appended claims correspond basically to the particulars of the embodiments of the present technology with the same names in the foregoing description. However, these embodiments are not limitative of the present technology that may also be implemented using various modifications and alterations of the embodiments so far as they are within the scope of the appended claims.

The procedures discussed above in connection with the embodiments may be construed as constituting a method having a series of such procedures. Also, the procedures may be construed as forming a program for causing a computer to execute a series of such procedures, or as constituting a recording medium storing such a program. The recording medium may be a Compact Disc (CD), a MiniDisc (MD), a Digital Versatile Disc (DVD), a memory card, or a Blu-ray Disc (registered trademark), for example.

The advantageous effects mentioned in this description are only examples and not limitative of the present disclosure. Further advantages will be apparent from a reading of the disclosure.

The present technology may be configured as follows:

(1) A memory cell including:
an N-type transistor configured to supply a current either from a source to a drain thereof or from the drain to the source;
a P-type transistor configured to supply a current from a source to a drain thereof; and
a storage element configured to store a logical value reflecting the direction of the current supplied from the drain of the N-type transistor and from the drain of the P-type transistor.

(2) The memory cell as stated in paragraph (1) above, in which at least either a gate width or a gate length of the N-type transistor is different from the corresponding gate width or the corresponding gate length of the P-type transistor.

(3) The memory cell as stated in paragraph (2) above, in which the gate width of the N-type transistor is narrower than the gate width of the P-type transistor.

(4) The memory cell as stated in paragraph (2) or (3) above, in which the gate length of the N-type transistor is longer than the gate length of the P-type transistor.

(5) The memory cell as stated in any one of paragraphs (1) to (4) above,
in which the storage element is a magnetic tunnel junction element.

(6) The memory cell as stated in any one of paragraphs (1) to (5) above,
in which the storage element is a colossal magneto-resistance element.

(7) A storage device including:
a plurality of memory cells each including an N-type transistor configured to supply a current either from a source to a drain thereof or from the drain to the source, a P-type transistor configured to supply a current from a source to a drain thereof, and a storage element configured to store a logical value reflecting the direction of the current supplied from the drain of the N-type transistor and from the drain of the P-type transistor; and
a driver configured to control a potential of the source and a potential of the drain.

(8) The storage device as stated in paragraph (7) above, in which the N-type transistor and the P-type transistor are arranged alternately in each of two directions perpendicular to one another.

(9) The storage device as stated in paragraph (7) or (8) above,
in which a gate of the N-type transistor is connected with a first word line,
a gate of the P-type transistor is connected with a second word line adjacent to the first word line,
the storage element is connected with the connection lines and with a first bit line, and
the source of the N-type transistor and the source of the P-type transistor are connected with a second bit line adjacent to the first bit line.

(10)
The storage device as stated in any one of paragraphs (7) to (9), in which, when given an instruction to rewrite the logical value, the driver causes the potential applied to either the source or the drain to become higher than the potential applied to the other.

REFERENCE SIGNS LIST

100 Memory controller
200 Nonvolatile memory
210 Interface
220 Address circuit
230 Column decoder
240 Memory control section
250 Column driver
260 Row decoder
270 Row driver
280 Memory cell array
281 Memory cell
282 Storage element
283 Storage layer
284 Insulating layer
285 Fixed layer
286 P-type transistor
287 N-type transistor

The invention claimed is:

1. A first memory cell, comprising:
an N-type transistor configured to supply a first current from one of a first source of the N-type transistor to a first drain of the N-type transistor or the first drain to the first source;
a P-type transistor configured to supply a second current from a second source of the P-type transistor to a second drain of the P-type transistor; and
a storage element configured to store a logical value reflecting a direction of the first current supplied from the first drain of the N-type transistor and a third current supplied from the second drain of the P-type transistor, wherein
the N-type transistor is adjacent to the P-type transistor in a first direction, a first gate of the N-type transistor is connected to a third gate of a P-type transistor of a second memory cell, along a second direction, and the first direction is different from the second direction.

2. The first memory cell according to claim 1, wherein, at least one of a first gate width or a first gate length of the N-type transistor of the first memory cell is different from a second gate width or a second gate length of the P-type transistor of the first memory cell.

3. The first memory cell according to claim 2, wherein the first gate width of the N-type transistor of the first memory cell is narrower than the second gate width of the P-type transistor of the first memory cell.

4. The first memory cell according to claim 2, wherein the first gate length of the N-type transistor of the first memory cell is longer than the second gate length of the P-type transistor of the first memory cell.

5. The first memory cell according to claim 1, wherein the storage element is a magnetic tunnel junction element.

6. The first memory cell according to claim 1, wherein the storage element is a colossal magneto-resistance element.

7. The first memory cell according to claim 1, wherein a second gate of the P-type transistor is connected to a fourth gate of N-type transistor of a third memory cell, along the second direction.

8. The first memory cell according to claim 1, wherein the first direction is perpendicular to the second direction.

9. A storage device, comprising:
a plurality of memory cells, wherein a first memory cell of the plurality of memory cells comprises:
an N-type transistor configured to supply a first current from one of a first source of the N-type transistor to a first drain of the N-type transistor or the first drain to the first source;
a P-type transistor configured to supply a second current from a second source of the P-type transistor to a second drain of the P-type transistor; and
a storage element configured to store a logical value reflecting a direction of the first current supplied from the first drain of the N-type transistor and a third current supplied from the second drain of the P-type transistor; and
a driver configured to control a potential of the first source and the second source, and a potential of the first drain and the second drain, wherein
the N-type transistor is adjacent to the P-type transistor in a first direction,
a first gate of the N-type transistor is connected to a third gate of a P-type transistor of a second memory cell of the plurality of memory cells, along a second direction, and
the first direction is different from the second direction.

10. The storage device according to claim 9, wherein
the first gate of the N-type transistor is connected with a first word line,
a second gate of the P-type transistor is connected with a second word line,
the storage element is connected with connection lines and with a first bit line, and
the first source of the N-type transistor and the second source of the P-type transistor are connected with a second bit line.

11. The storage device according to claim 9, wherein, based on an instruction to rewrite the logical value, the driver is further configured to control a first potential applied to a first of the first source or the first drain to become higher than a second potential applied to a second of the first source or the first drain.

12. The first memory cell according to claim 7, wherein the first memory cell is adjacent to the second memory cell and the third memory cell, along the second direction.

* * * * *